United States Patent [19]
Görnig

[11] Patent Number: 5,689,421
[45] Date of Patent: Nov. 18, 1997

[54] VEHICLE SAFETY SYSTEM

[76] Inventor: Thomas Görnig, Bahnweg 21, 85229 Markt Indersdorf, Germany

[21] Appl. No.: 790,523

[22] Filed: Jan. 29, 1997

Related U.S. Application Data

[63] Continuation of Ser. No. 344,714, Nov. 18, 1994, abandoned.

[30] Foreign Application Priority Data

Nov. 19, 1993 [DE] Germany ............... 9317678 U

[51] Int. Cl.$^6$ .................................. B60R 21/32
[52] U.S. Cl. .................. 364/424.055; 340/436; 307/10.1; 180/268; 280/735
[58] Field of Search ............ 364/424.055, 424.056; 340/436, 438, 669; 307/10.1; 180/274, 282, 268; 280/734, 735

[56] References Cited

U.S. PATENT DOCUMENTS

| | | | |
|---|---|---|---|
| 3,935,470 | 1/1976 | Cake | 180/270 |
| 4,620,721 | 11/1986 | Scholz et al. | 280/735 |
| 4,984,651 | 1/1991 | Grösch et al. | 180/282 |
| 5,071,160 | 12/1991 | White et al. | 280/735 |
| 5,232,243 | 8/1993 | Blackburn et al. | 280/735 |
| 5,330,226 | 7/1994 | Gentry et al. | 280/735 |
| 5,398,185 | 3/1995 | Omura | 280/735 |
| 5,400,867 | 3/1995 | Miller et al. | 280/735 |
| 5,411,289 | 5/1995 | Smith et al. | 280/735 |
| 5,413,378 | 5/1995 | Steffens, Jr. et al. | 280/735 |
| 5,416,360 | 5/1995 | Huber et al. | 280/735 |

FOREIGN PATENT DOCUMENTS

| | | |
|---|---|---|
| 0 284 770 | 10/1988 | European Pat. Off. . |
| 27 37 919 | 3/1979 | Germany . |
| 212 425 | 8/1984 | Germany . |
| 38 09 074 | 10/1989 | Germany . |
| 38 11 217 | 10/1989 | Germany . |
| 38 31 335 | 1/1990 | Germany . |
| 40 16 610 | 11/1991 | Germany . |
| 40 23 109 | 1/1992 | Germany . |
| 40 32 757 | 4/1992 | Germany . |
| 41 28 230 | 5/1992 | Germany . |
| 42 12 018 | 10/1992 | Germany . |
| 41 15 202 | 11/1992 | Germany . |
| 42 14 222 | 4/1993 | Germany . |

*Primary Examiner*—Gary Chin
*Attorney, Agent, or Firm*—Jacobson, Price, Holman & Stern, PLLC

[57] ABSTRACT

A vehicle safety system including an air bag operating unit and at least one sensor component. The vehicle safety system, in a simple and reliable fashion, ensures that signals coming from the at least one sensor component are supplied to a control unit for an air bag such that the current status of a vehicle occupant may be reliably ascertained. The air bag operating unit is preferably fitted with a digital microprocessor. The air bag operating unit is preferably connected with the at least one sensor component via a transmission line, and the at least one sensor component repeatedly transmits to the air bag operating unit digital information at predetermined time intervals. The digital information is indicative of the status of the vehicle occupant.

34 Claims, 3 Drawing Sheets

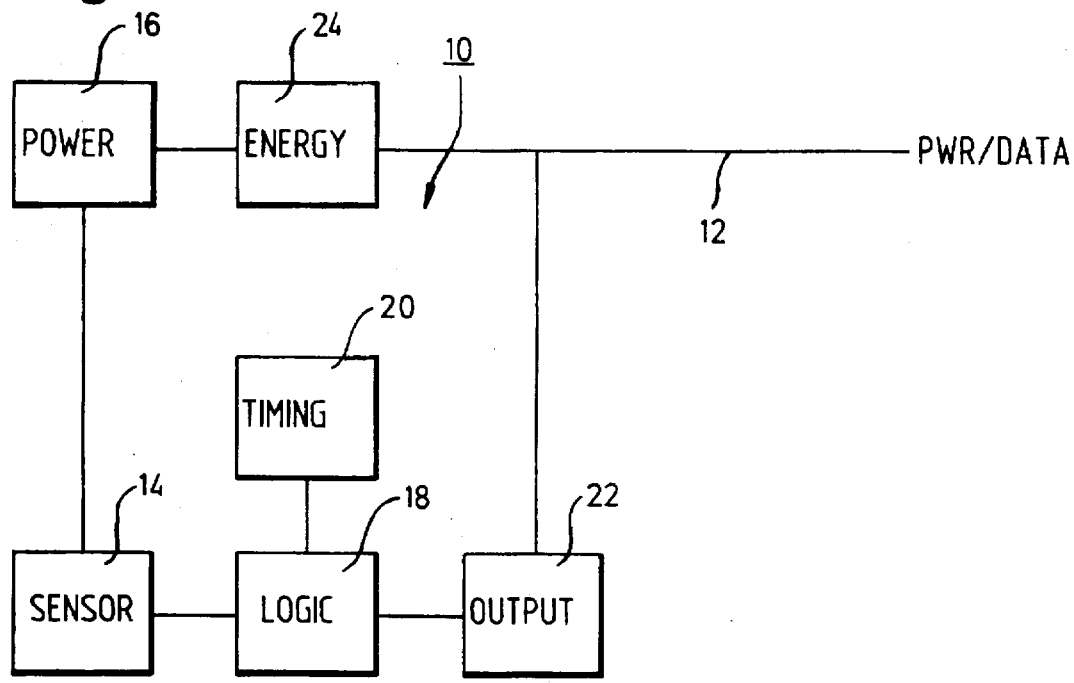
Fig. 1
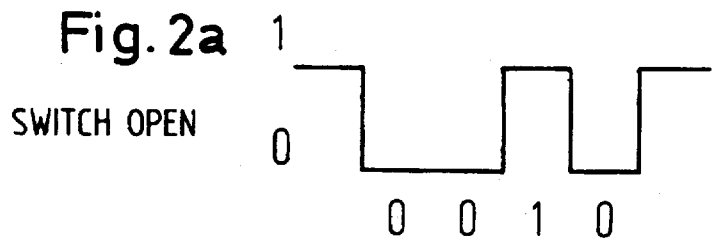
Fig. 2a SWITCH OPEN
0 0 1 0
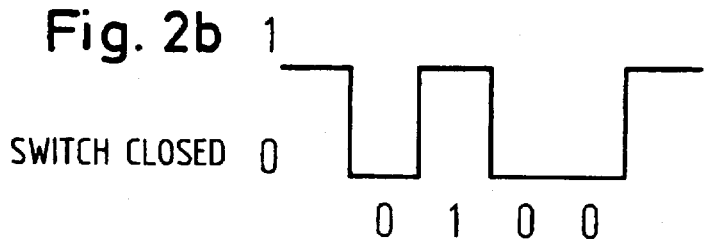
Fig. 2b SWITCH CLOSED
0 1 0 0
START DATA DATA STOP
X /X
20 ms

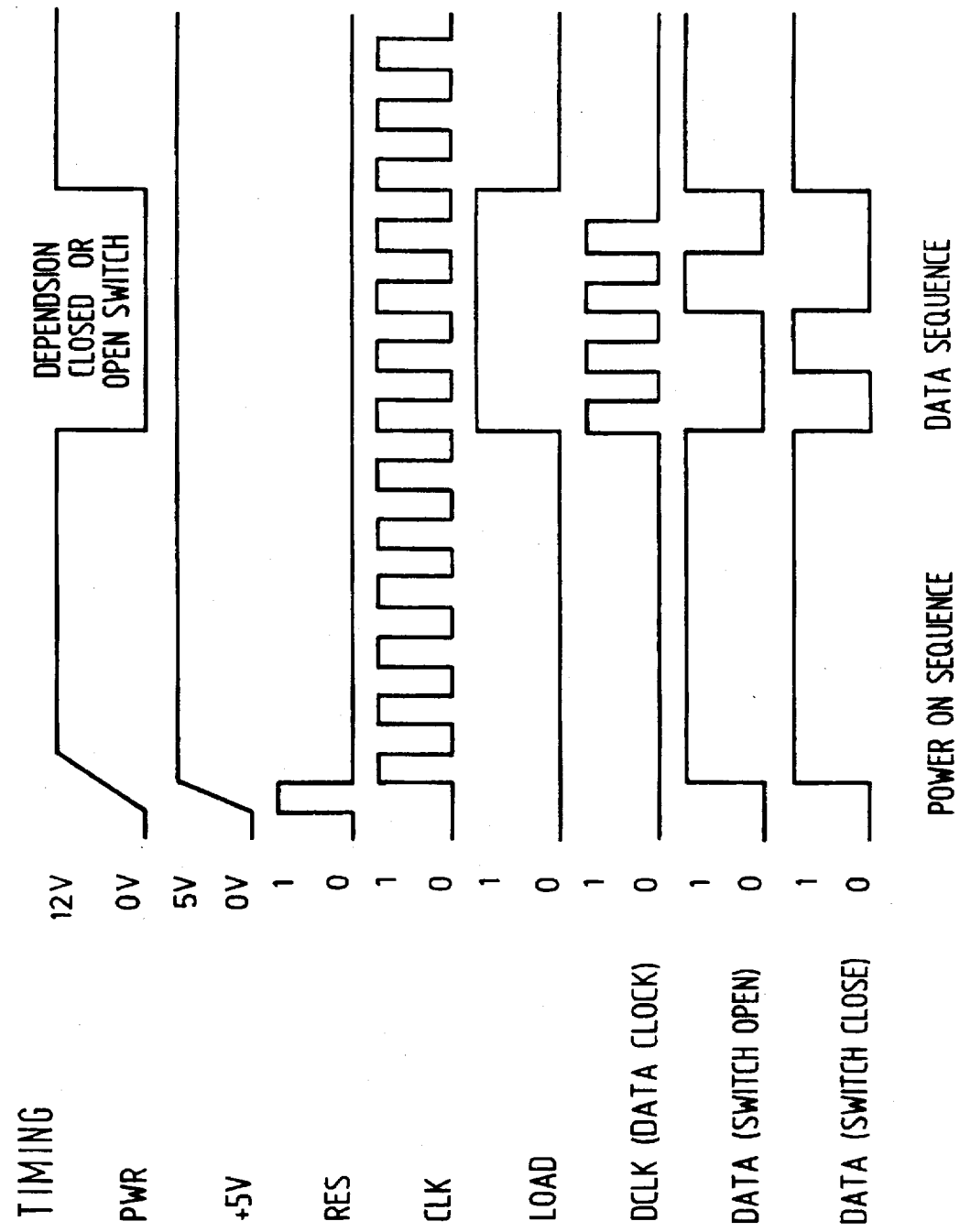

VEHICLE SAFETY SYSTEM

This is a continuation of application Ser. No. 08/344,714, filed Nov. 18, 1994 which was abandoned upon the filing hereof.

BACKGROUND OF THE INVENTION

The present invention relates to an air bag operating unit and at least one sensor component for detecting the status of a vehicle occupant and transmitting digital information indicative thereof to the air bag operating unit.

In known safety systems, such as air bag operating units, it is quite possible for there to be spurious transmissions along the control lines between simple circuit elements. For example, when a short circuit occurs along a control line of the safety system, the system may wrongly assume that a switch is closed. On the other hand, if the control line is broken, the erroneous assumption may be that a respective switch is open. Such erroneous information can be prevented by wiring a resistor in parallel to the switch. However, doing so would require a substantially more elaborate decoding of the signal by the air bag operating unit.

SUMMARY OF THE INVENTION

One object of the invention is therefore to create a vehicle safety system which, in a simple and reliable fashion, ensures that signals coming from sensors may be supplied to a control unit for an air bag.

In order to achieve this and other objects of the invention, a vehicle safety system is provided with an air bag operating unit and at least one sensor component capable of ascertaining the current status of a vehicle occupant. The air bag operating unit comprises a digital microprocessor and is connected with at least one sensor component via a transmission line. The sensor component repeatedly sends digital information to the air bag operating unit at predetermined intervals, which information is indicative of the status of the vehicle occupant. Since the air bag operating unit employs a digital microprocessor, it can directly receive digital words from the sensor unit at predetermined intervals. This means that the integrity of the signal transmission line is automatically checked.

The vehicle safety system in accordance with the invention may, with advantage, be so designed that the sensor component is able to be supplied with DC power via the transmission line. In such a system, in addition to the grounding line, only one line is necessary for the transmission of the sensor signals and for the supply of DC power.

Each item of status information may be transmitted to the air bag operating unit as a digital word which, in turn, consists of at least two binary bits. When a digital word consists of two binary bits, it will then comprise a start bit and a data. Improved redundancy is achieved if the digital word comprises a start bit, two data bits and a stop bit.

In accordance with a still further development of the invention, the sensor component may include one sensor element which continuously provides an output status signal. Furthermore, it may comprise a timer and a digital signal generator controlled by the timer. The digital signal generator then produces digital words in accordance with the output of the sensor element.

A seat belt system associated with the vehicle safety system of the present invention may include a belt buckle, in which case it is possible to detect whether an associated belt is engaged. Such checking of the belt may, on the one hand, be performed by the sensor component checking whether the belt buckle is fastened or not. Alternatively, it is possible to check the belt retractor using the sensor component to determine whether the belt is unfastened.

In accordance with a further embodiment of the invention, the sensor component may be designed as a switch with "on" or "off" statuses. In this respect, the sensor component may be a Hall generator, wherein the position of a magnet indicates the condition of the part to be checked. If the sensor is embodied in a Hall generator, the output signal of the Hall generator may be transmitted through a Schmitt trigger before it is supplied to the digital signal generator. Alternatively, the sensor element may be designed in the form of a simple electromechanical switch. The sensor element may also be designed in the form of a reed switch.

The present invention provides a fully digitalized system which may be readily adapted to air bag systems. Using a continuous protocol producing means, the correct function of the system may be confirmed. The respective signals are readily decoded.

Further advantageous developments and convenient forms of the invention will be understood from the following detailed descriptive disclosure of one embodiment thereof in conjunction with the accompanying drawings.

BRIEF DESCRIPTION OF THE DRAWINGS

FIG. 1 is a block circuit diagram of a vehicle safety system in accordance with the present invention.

FIG. 2 shows two examples of digital words which are indicative of switch condition.

FIG. 4 is a timing diagram illustrating the temporal overlap of the present voltage values or signals.

DETAILED DESCRIPTION OF A PREFERRED EMBODIMENT

Figure 3:
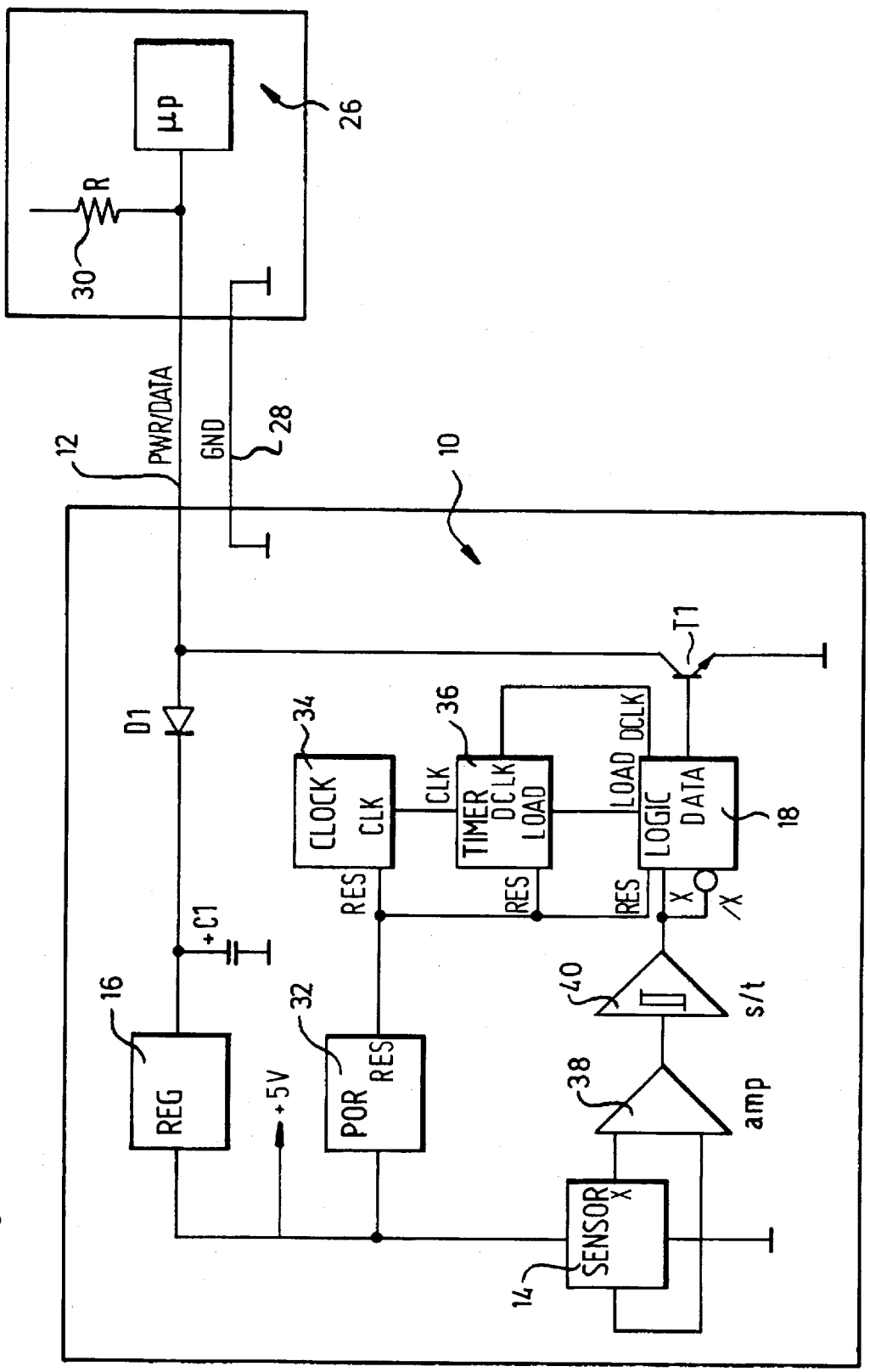
FIG. 3 is a circuit diagram of an exemplary embodiment of the vehicle safety system.

In the block circuit diagram of FIG. 1, an exemplary sensor component 10 is illustrated. The sensor component 10 is connected via a transmission line 12, which serves as a power supply or data connection, with an air bag operating unit (not illustrated in detail here). The sensor component 10 comprises a sensor, which is supplied via a voltage regulator 16 with the necessary operational voltage. A sensor element 14 continuously sends a status signal to a digital signal generator (DSG) 18, which is controlled by a timer 20. The digital words produced in the digital signal generator 18 are fed via an output device 22 to the line 12. When a signal is being supplied to the line 12, the sensor component 10 cannot be supplied with power along this line 12. During this time, the sensor component 10 may be supplied with power from an energy or power supply 24.

FIG. 3 shows a particular design of the vehicle safety system. Here, the sensor component 10 and the air bag operating unit 26 are respectively shown in dotted boxes. The sensor component 10 and the air bag operating unit 26 are connected to one another via the line 12 and a grounding line 28. From a vehicle battery (not illustrated) a 12 V supply voltage may be fed via a resistor 30, which is arranged inside the air bag operating unit, and the line 12 to the voltage regulator 16 in the sensor component 10. The voltage regulator 16 serves to supply a sensor element 14, a reset logic component 32 and all circuits with a 5 V operating voltage. The reset logic component 32 is connected to a clock generator 34, a timer 36 and a digital signal generator 18. These three units simultaneously receive a signal from the reset logic component 32 if the system is switched on (i.e., is supplied with power). The corresponding signal from the reset logic component 32 is denoted RES and is represented as a pulse in FIG. 4. After receiving this reset signal, the clock generator 34 continuously produces a clock pulse CLK, which is also represented in FIG. 4. This signal is passed on to the timer 36, which produces the corresponding signals "LOAD" and "DCLK" (data clock) and supplies the same to the digital signal generator 18. These signals are also represented in FIG. 4. The corresponding LOAD is repeated at predetermined time intervals of, for instance, every 250 ms. For the time interval during which the "LOAD" signal is produced, the digital signal generator 18 processes the signals 14 stemming from the sensor element 14 (see FIG. 4).

The sensor element 14 in the illustrated embodiment is a Hall generator having picked up signal X which is amplified by an amplifier 38 and which is converted into a digital signal by a Schmitt trigger 40. This digital signal X is passed on to the signal generator 18, on the one hand, directly and, on the other hand, in an inverted form such as /X. In the digital signal generator 18, a four bit digital word is produced consisting of four binary bits, as shown in FIG. 2. The start bit is followed by a first data bit, in which the value X is contained. As the next bit, there follows a further data bit in the form of the inverted signal value /X. Finally there is a stop bit.

FIG. 2a shows the digital word for the opened switch setting and FIG. 2b shows the digital word for the closed switch position. These two settings are also represented in FIG. 4. The digital word is output via a transistor T1 to the line 12. During the transmission time for the data along the line 12, no voltage is passed on to the system, something which may be seen from the temporal changes of the voltage on the line 12, which is referenced "pwr" in FIG. 4. For this time interval, which for example lasts 20 ms, the power supply is maintained by means of a capacitor C1 (corresponding to the energy supply 24 in FIG. 1). A diode D1 serves for decoupling the capacitor C1 from the line 12 (see FIG. 3).

I claim:

1. A vehicle safety system comprising an air bag operating unit and at least one sensor component for sensing a current status of a vehicle occupant, said current status corresponding to whether said vehicle occupant is seated in a respective seat or how said vehicle occupant is seated on said respective seat or also corresponding to whether a seat belt associated with said vehicle occupant is fastened, the air bag operating unit being located apart from said respective seat, said air bag operating unit including a digital processing device and being connected with said at least one sensor component by a transmission line, said at least one sensor component being located at said respective seat and arranged so as to repeatedly send digital information from said respective seat to the air bag operating unit at predetermined time intervals, said digital information being indicative of said current status.

2. The vehicle safety system according to claim 1, and further comprising means for supplying said at least one sensor component with DC power via the transmission line.

3. The vehicle safety system according to claim 1, and further comprising means for transmitting said digital information from said at least one sensor component to said air bag operating unit as a digital word, wherein said digital word comprises two binary bits.

4. The vehicle safety system according to claim 1, wherein said at least one sensor component comprises a sensor element which continuously outputs a status signal; a timer; and a digital signal generator adapted to be controlled by the timer to produce digital words in accordance with an output from the sensor element.

5. The vehicle safety system according to claim 1, and further comprising a seat belt system with at least one belt buckle, said at least one sensor component being adapted to detect which one or ones of a plurality of belts in said seat belt system are fastened.

6. The vehicle safety system according to claim 5, wherein said sensor component is capable of determining which of said at least one belt buckle is fastened or unfastened.

7. The vehicle safety system according to claim 5, wherein said at least one sensor component is capable of ascertaining whether a belt in said seat belt system is being used.

8. The vehicle safety system according to claim 1, wherein said at least one sensor component includes a sensor element comprising a switch with "on" and "off" switch settings.

9. The vehicle safety system according to claim 8, wherein said sensor element comprises a Hall generator, wherein a magnet position indicates said current status.

10. The vehicle safety system according to claim 9, wherein an output signal from the Hall generator is conducted by a Schmitt trigger to a digital signal generator.

11. The vehicle safety system according to claim 8, wherein the sensor element comprises a simple electromechanical switch.

12. The vehicle safety system according to claim 8, wherein the sensor element comprises a reed switch.

13. The vehicle safety system according to claim 1, wherein said digital information comprises a digital word, said digital word comprising at least one start bit and one data bit.

14. The vehicle safety system according to claim 13, wherein said digital word comprises said at least one start bit, two data bits including said one data bit, and one stop bit.

15. The vehicle safety system according to claim 1, wherein said transmission line comprises:

a single line extending between said at least one sensor component and said air bag operating unit, and a vehicle ground.

16. The vehicle safety system according to claim 1, wherein said at least one sensor component includes a Schmitt trigger and a digital signal generator, said Schmitt trigger having a direct output and an inverse output connected to said digital signal generator.

17. The vehicle safety system according to claim 1, wherein said at least one sensor component includes a transistor for outputting said digital information in the form of a digital word on said transmission line, said at least one sensor component further comprising a capacitor for storing electrical energy received via said transmission line, said at least one sensor component being powered by electrical energy from said capacitor during transmission of said digital word.

18. The vehicle safety system according to claim 17, wherein said at least one sensor component further comprises a diode for decoupling said capacitor from the transmission line.

19. The vehicle safety system according to claim 1, wherein said at least one sensor component includes a voltage regulator for maintaining an operational voltage in said at least one sensor component.

20. The vehicle safety system according to claim 1 wherein said at least one sensor component includes a reset logic component, a clock generator, a timer, and a digital signal generator; and wherein said clock generator, said timer, and said digital signal generator are responsive to an output from said reset logic component which is simultaneously applied to said clock generator, said timer, and said digital signal generator when the vehicle safety system is activated by powering of the vehicle safety system.

21. The vehicle safety system according to claim 20, wherein said clock generator responds to said output from the reset logic component by continuously producing a clock pulse, said clock pulse being applied to said timer, said timer being responsive to said clock pulse to produce a load signal and a data clock signal, said load and data clock signals being applied to said digital signal generator, said digital signal generator being arranged so as to process signals from a sensing element of said at least one sensor component when said load signal is being applied.

22. A vehicle safety system comprising an air bag operating unit and at least one sensor component for sensing a current status of a vehicle occupant, said air bag operating unit including a digital microprocessor and being connected to said at least one sensor component by a transmission line, said at least one sensor component having means for repeatedly sending digital information from said at least one sensor component to the air bag operating unit at predetermined time intervals va said transmission line, said digital information being indicative of said current status, said current status being dependent upon at least one of several conditions, said several conditions including whether the vehicle occupant is seated in a particular seat, whether a particular seat belt has been withdrawn from a seat belt retractor, and whether a particular seat belt has been secured to a corresponding seat belt buckle, wherein said at Least one sensor component is located at said particular seat or said particular seat belt or said corresponding seat belt buckle, and wherein said air bag operating unit is located away from said particular seat, said particular seat belt and said corresponding seat belt buckle.

23. The vehicle safety system according to claim 22, and further comprising means for supplying said at least one sensor component with DC power via the transmission line.

24. The vehicle safety system according to claim 23, and further comprising:

means for storing energy derived from said DC power and for supplying said energy to said at least one sensor component while said digital information is being sent by said at least one sensor component; and means for isolating said energy from the transmission line to prevent interference with said digital information.

25. The vehicle safety system according to claim 22, wherein said digital information comprises a digital word, and said digital word comprises at least one start bit and one data bit.

26. The vehicle safety system according to claim 25, wherein said digital word comprises said at least one start bit, two data bits including said one data bit, and one stop bit.

27. The vehicle safety system according to claim 22, wherein said at least one sensor component includes a switch with an "on" setting and an "off" setting.

28. The vehicle safety system according to claim 22, wherein said transmission line comprises:

a single line extending between said at least one sensor component and said air bag operating unit, and a vehicle ground.

29. The vehicle safety system according to claim 22, wherein said at least one sensor component includes a Schmitt trigger and a digital signal generator, said Schmitt trigger having a direct output and an inverse output connected to said digital signal generator.

30. The vehicle safety system according to claim 22, wherein said at least one sensor component includes a transistor for outputting said digital information in the form of a digital word on said transmission line, said at least one sensor component further comprising a capacitor for storing electrical energy received via said transmission line, said at least one sensor component being powered by electrical energy from said capacitor during transmission of said digital word.

31. The vehicle safety system according to claim 30, wherein said at least one sensor component further comprises a diode for decoupling said capacitor from the transmission line.

32. The vehicle safety system according to claim 22, wherein said at least one sensor component includes a voltage regulator for maintaining an operational voltage in said at least one sensor component.

33. The vehicle safety system according to claim 22, wherein said at least one sensor component includes a reset logic component, a clock generator, a timer, and a digital signal generator; and wherein said clock generator, said timer, and said digital signal generator are responsive to an output from said reset logic component which is simultaneously applied to said clock generator, said timer, and said digital signal generator when the vehicle safety system is activated by powering of the vehicle safety system.

34. The vehicle safety system according to claim 33, wherein said clock generator responds to said output from the reset logic component by continuously producing a clock pulse, said clock pulse being applied to said timer, said timer being responsive to said clock pulse to produce a load signal and a data clock signal, said load and data clock signals being applied to said digital signal generator, said digital signal generator being arranged so as to process signals from a sensing element of said at least one sensor component when said load signal is being applied.

* * * * *